United States Patent [19]

Terajima

[11] Patent Number: 5,254,898
[45] Date of Patent: Oct. 19, 1993

[54] VIBRATOR
[75] Inventor: Kokichi Terajima, Tokyo, Japan
[73] Assignee: Akai Electric Co., Ltd., Tokyo, Japan
[21] Appl. No.: 935,630
[22] Filed: Aug. 25, 1992
[30] Foreign Application Priority Data Aug. 28, 1991 [JP] Japan ........................ 3-240330

[51] Int. Cl.[5] .......................................... H01L 41/08
[52] U.S. Cl. ............................. 310/321; 310/348; 310/351; 310/352; 310/353
[58] Field of Search ............... 310/321, 348, 351–353

[56] References Cited

U.S. PATENT DOCUMENTS

| 2,470,609 | 5/1949 | Elmore et al. | 310/348 |
| 2,505,121 | 4/1950 | Knights | 310/348 |
| 3,678,309 | 7/1972 | Choffat | 310/353 |
| 4,123,680 | 10/1978 | Kemper et al. | 310/353 |
| 4,267,479 | 5/1981 | Kato | 310/348 |
| 5,117,148 | 5/1992 | Nakamura | 310/367 |

FOREIGN PATENT DOCUMENTS

| 0055490 | 5/1977 | Japan | 310/352 |
| 0070783 | 6/1978 | Japan | 310/348 |
| 0082164 | 3/1990 | Japan | 310/321 |
| 2-228518 | 9/1990 | Japan . | |
| 2-228519 | 9/1990 | Japan . | |
| 0013006 | 1/1991 | Japan | 310/351 |
| 3-34613 | 2/1991 | Japan . | |
| 0569003 | 8/1977 | U.S.S.R. | 310/348 |

Primary Examiner—Mark O. Budd
Assistant Examiner—Thomas M. Dougherty
Attorney, Agent, or Firm—Meltzer, Lippe, Goldstein

[57] ABSTRACT

A vibrator is disclosed having a vibrating body with a polygonal lateral cross-section. Two piezoelectric elements are disposed on nonparallel side surfaces of the vibrating body. A support structure is provided which supports the vibrating body at two support points of the vibrating body. The support points are located in a split plane which passes through the line of intersection of the two planes in which the two side surfaces lie and bisects the inner angle formed by these two planes. Furthermore, the support points are located on opposite sides of the vibrating body and each support point is located at or near a nodal point of the vibrator.

5 Claims, 2 Drawing Sheets

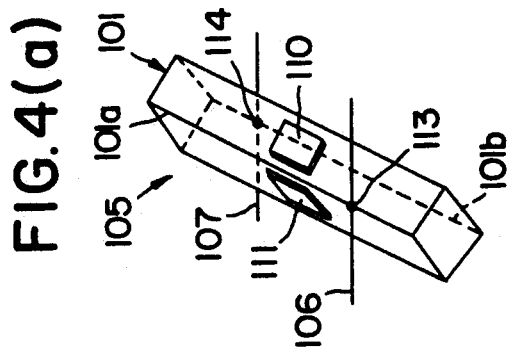
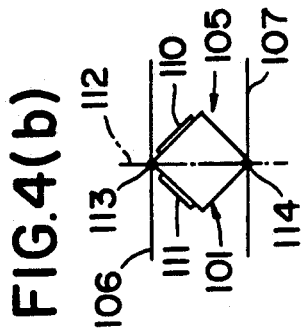
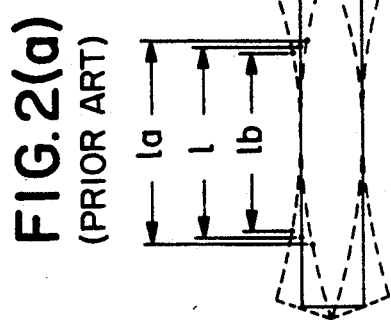
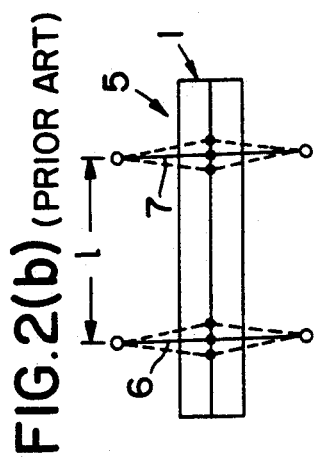
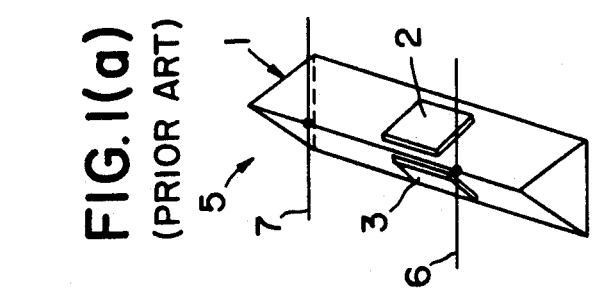
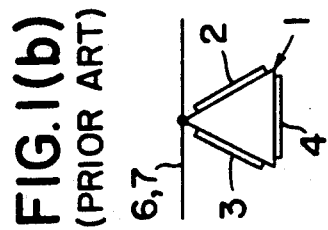

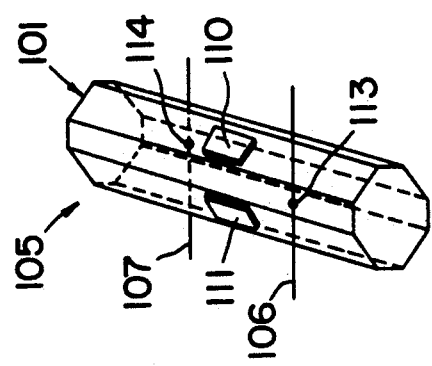
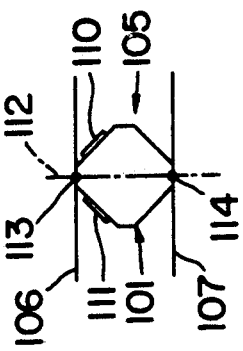
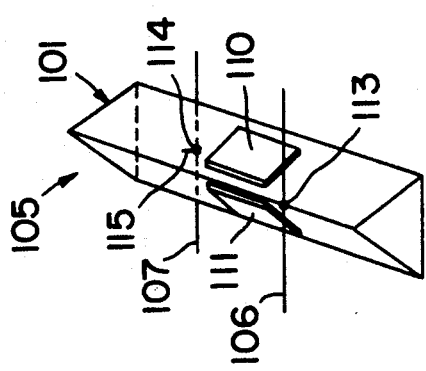
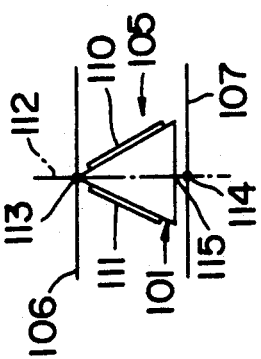
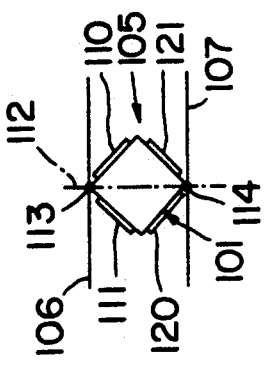
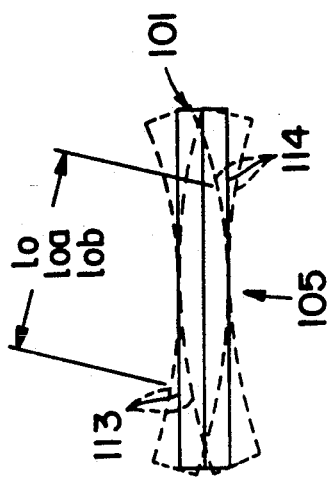

1

VIBRATOR

FIELD OF THE INVENTION

This invention relates to a vibrator suitable for use in vibration gyros. More specifically, the invention relates to a vibrator wherein a vibrating body is supported on a support structure.

BACKGROUND OF THE INVENTION

A prior art support structure for a vibrator is shown, for example, in FIGS. 1(a) and 1(b). This prior art support structure supports a vibrator 5 which includes two drive piezoelectric elements 2 and 3 and a feedback piezoelectric element 4 adhered to the three side surfaces, respectively, of a vibrator body 1 having a triangular shaped lateral cross-section. The support structure includes two filaments 6 and 7 used for support which are connected to vibrator body 1 at positions that correspond to two nodal points of the vibrator 5 along the ridgeline of the two side surfaces of the vibrator body 1 to which drive piezoelectric elements 2 and 3 are adhered. This vibrator 5 flexibly vibrates in directions at right angles to the side surface to which feedback piezoelectric element 4 is adhered by means of applying a drive a.c. voltage to drive piezoelectric elements 2 and 3.

With the prior art support structure of this sort, the distance between the points of connection of the two support filaments 6 and 7 to vibrator body 1 varies because of the flexural vibration in vibrator 5. Thus, flexural deformations arise in filaments 6 and 7 which tend to damp the vibration of vibrator 5. That is, vibrator 5 produces flexural vibrations as 5 illustrated in FIG. 2(a). As depicted, the distance 1 between the support points in the state of rest is stretched to the distances $1_a$ and $1_b$ during vibration so that deformations occur in filaments 6 and 7 as shown by the broken lines in FIG. 2(b).

With this prior art technology, the vibrator 5 is supported by suspension because the two support filaments 6 and 7 are connected at the ridgeline. Thus, when a horizontal vibration acts on vibrator 5 as an external force in the directions of arrows 8 (as shown by the end view in FIG. 3), the vibrator 5 tends to swing like a pendulum in the directions of arrows 9 about a center line between the support points on filaments 6 and 7. Consequently, a problem arises when this vibrator 5 is used as a vibration gyro in that its swinging motion is mistakenly detected as a rotation motion.

An object of this invention is to provide a support structure for a vibrator which is capable of effectively preventing damping of the vibration of the vibrator, and which is capable of satisfactorily eliminating any concern over mistaken detections.

SUMMARY OF THE INVENTION

This and other objects are achieved by the present invention which provides a vibrator including a vibrating body with a polygonal lateral cross-section, and at least two piezoelectric elements disposed on two non-parallel side surfaces, respectively, of the vibrating body. A support structure is provided which supports the vibrating body at two support points of the vibrating body. The support points are located in a split plane which passes through the line of intersection of two planes in which the two side surfaces lie and bisects the inner angle formed by these two planes. One of the support points is located at or near a position corresponding to one nodal point of the vibrator. The other support point is located at or near a position corresponding to another nodal point of the vibrator but on a side of the vibrator which is opposite from the first support point.

With the support structure of the present invention, the two support points serve as points of connection to two filaments, respectively, that support the vibrator. By supporting the vibrator firmly at these two support points on opposite sides of the vibrating body, it is possible to prevent, effectively, the support filaments from damping the vibration of the vibrator by sufficiently decreasing variations in the distance between the two support points even when the vibrator has flexural vibration. Thus, the formation of a swinging pendulum motion in the vibrator and, consequently, any erroneous detections of the vibrator can be effectively prevented.

BRIEF DESCRIPTION OF THE DRAWINGS

Preferred embodiments of this invention will be explained below based on the drawings wherein like numerals refer to like elements, and wherein:

FIGS. 1(a)–(b) show a prior art vibrator;

FIGS. 2(a)–(b) show a variation in the distance between support points of the prior art vibrator;

FIG. 3 illustrates an end view showing pendulum vibration of the prior art vibrator;

FIGS. 4(a)–(b) show an embodiment of the present invention;

FIG. 5 illustrates an end view showing another embodiment of the inventive vibrator;

FIG. 6 illustrates a side view showing a flexural vibration state of the vibrator depicted in FIGS. 4(a)–(b);

FIGS. 7(a)–(b) show a third embodiment of the inventive vibrator; and

FIGS. 8(a)–(b) show a fourth embodiment of the inventive vibrator.

DETAILED DESCRIPTION OF THE INVENTION

FIGS. 4(a)–(b) show an embodiment of this invention, including a vibrator 105 with piezoelectric elements 110 and 111 which have the function, among other functions, of vibrating a vibrator body 101. The piezoelectric elements 110 and 111 are adhered to two side surfaces, respectively, that are not mutually parallel, of the vibrator body 101 which, in this embodiment, has a rectangular lateral cross-sectional shape.

When such a vibrator 105 is used in a vibration gyro, a drive a.c. voltage is, for example, applied to piezoelectric elements 110 and 111, respectively, via their impedance elements, while at the same time, the output voltages of the connecting points between piezoelectric elements 110 and 111 and their respective impedance elements are utilized for detection of the Coriolis force and for feedback to the drive circuit. Such a drive circuit is disclosed in U.S. patent application Ser. No. 07/894,017 entitled "Vibrator Control Apparatus" which corresponds to Japanese Patent Application Hei 3-162330. Thus, it is possible to detect the direction of rotation and the angular velocity of the vibrator 105.

Vibrator 105, for example, as shown in FIG. 5, can also have additional piezoelectric elements 120 and 121 adhered to the other two side surfaces, respectively, of vibrator body 101. These piezoelectric elements 120 and 121 can also function in the same manner as the aforementioned piezoelectric elements 110 and 111, or the drive and feedback functions can be separated with piezoelectric elements 110 and 111 being used for drive and piezoelectric elements 120 and 121 being used for feedback.

The support structure of vibrator 105 will next be explained based on what is shown in FIGS. 4(a)-(b).

Split plane 112 passes through a plane that includes the side surface to which piezoelectric element 110 is adhered and through a plane that includes the side surface to which piezoelectric element 111 is adhered. The split plane 112 equally divides the inner angle of these two planes. A point in a position corresponding to one nodal point of vibrator 105 or in a position nearby, which position is located on the ridgeline 101a of vibrator body 101, is selected as one support point 113. On the other hand, a point at a position corresponding to the other nodal point of vibrator 105, or in a position nearby, which position is located on the ridgeline 101b opposite to the ridgeline 101a, is selected as the other support point 114. The midpoints of each filaments 106 and 107 are connected to the support points 113 and 114, respectively. The end portions of these filaments 106 and 107 are connected to a support means that is not illustrated.

Using such a support structure for vibrator 105, when a drive a.c. voltage is applied respectively to piezoelectric elements 110 and 111, the vibrator 105 experiences flexural vibrations. FIG. 6 is a side view showing such a flexural vibration state, in which the distances $1_{0a}$ and $1_{0b}$ between support points 113 and 114 under the vibration of vibrator 105 assume values that very closely approximate the distance $1_0$ between these support points 113 and 114 of vibrator 105 at a state of rest. Thus, it is apparent that variations in support point distances that accompany flexural vibration are substantially prevented. Consequently, the amount of flexural deformation of support filaments 106 and 107 arising from the flexural deformation of vibrator 105 is effectively damped and vibration damping of vibrator 105 arising from such flexural deformations is effectively prevented. With this support structure, vibrator 105 is supported at its opposite sides so that the pendulum motion of vibrator 105, from the action of external forces, is also effectively prevented, and thus, the likelihood of aberrant motion of vibrator 105 is satisfactorily removed.

FIGS. 7(a)-(b) show another embodiment of the present invention, wherein the lateral cross-sectional shape of vibrating body 101', is triangular. In FIGS. 7(a)-(b), the vibrator 105, is constructed by adhering the piezoelectric elements 110 and 111, which vibrate the vibrator body 101', to two sides of vibrator body 101', respectively. One point on the ridgeline is selected as support point 113 and the other support point 114 is located on the side surface opposite this ridgeline. In this embodiment, the first support point 113 is located at or near a position that corresponds to one nodal point of vibrator 105' in the same manner as described before. The other support point 114 projects from a position on the opposite or nearly opposite side surface, which has no piezoelectric elements, and is located on an extension 115 which is in the plane 112. In this embodiment, filaments 106 and 107 are also connected to the supports 113 and 114, respectively. The damping of the flexural vibration of vibrator 105' is prevented in the same manner as in the example described above by connecting the end portions of these filaments 106 and 107 to a support means not illustrated. Furthermore, pendulum motion can be effectively prevented in the vibrator itself.

FIGS. 8(a)-(b) depict still another embodiment of the invention in which the lateral cross-sectional shape of vibrating body 101" is octagonal. In this example, the vibrator 105" is constructed with piezoelectric elements 110 and 111 adhered to two sides, respectively, that are not mutually parallel. One support point 113 is located at or near a position opposite one nodal point of vibrator 105". The support point 113 lies within the split plane 112 that passes through the intersection line of the planes of the side surfaces to which piezoelectric elements 110 and 111 are adhered and that evenly divides the inner angle of these planes. In the drawing, this support point 113 is located on the narrow surface adjacent to both side surfaces to which piezoelectric elements 110 and 111 are adhered. The other support point 114 is positioned at or near a position corresponding to the other nodal point of vibrator 105" on the narrow surface opposite to the narrow surface on which the support point 113 is located. The filaments 106 and 107 are connected to these support points 113 and 114, respectively.

It may be appreciated that this embodiment will also be able to offer the same effective function as each of the other previously described embodiments.

To summarize what has been said above, by sufficiently decreasing variations in the distance between support points, which variations result from flexural vibration in the vibrator, this invention is capable of effectively preventing flexural deformations from occurring in filaments used for support and, consequently, preventing vibration damping in the vibrator. Also, by supporting the vibrator at support points which are positioned on separated axes, it is possible, effectively, to restrain the formation of pendulum motion in the vibrator even when external forces act on it. This enables the nearly complete elimination of erroneous detection of a state of rotation where the vibrator is used as a vibration gyro.

Finally, the aforementioned embodiments are intended to be merely illustrative. Numerous other embodiments may be devised by those having ordinary skill in the art without departing from the scope of the following claims.

I claim:

1. A vibrator comprising
   a vibrating body having a polygonal lateral cross-section,
   at least two piezoelectric elements, each respectively disposed on one of two nonparallel side surfaces of said vibrating body, and
   a support structure which supports said vibrating body at two support points of said vibrating body, said support points being located in a split plane which passes through a line of intersection of two planes in which said nonparallel side surfaces lie, said split plane bisecting an inner angle formed by said two planes,
   wherein said support points are located on opposing sides of said vibrating body and wherein each of said support points is positioned in the region of a nodal point of said vibrator.

2. The vibrator of claim 1 wherein said nonparallel side surfaces are adjacent to one another.

3. The vibrator of claim 1 wherein at least one of said support points is located on a ridgeline at the intersection of two side surfaces of said vibrating body.

4. The vibrator of claim 1 wherein at least one of said support points is located on an extension above a side surface of said vibrating body.

5. The vibrator of claim 1 wherein said support structure comprises two filaments, each of said filaments being connected to said vibrating body at one of said support points, respectively.

* * * * *